United States Patent [19]
Kosteva et al.

[11] Patent Number: 5,955,782
[45] Date of Patent: Sep. 21, 1999

[54] APPARATUS AND PROCESS FOR IMPROVED DIE ADHESION TO ORGANIC CHIP CARRIERS

[75] Inventors: Stephen John Kosteva; David Michael Passante, both of Endicott; William John Rudik, Vestal; David John Russell, Apalachin; Jonathan Craig Whitcomb, Endicott, all of N.Y.

[73] Assignee: International Business Machines Corporation, Armonk, N.Y.

[21] Appl. No.: 08/964,037

[22] Filed: Nov. 4, 1997

Related U.S. Application Data

[63] Continuation of application No. 08/484,809, Jun. 7, 1995, abandoned.

[51] Int. Cl.⁶ ............................................. H01L 23/34
[52] U.S. Cl. ...................... 257/720; 257/712; 257/713
[58] Field of Search ............................ 257/720, 712, 257/713

[56] References Cited

U.S. PATENT DOCUMENTS

| | | | |
|---|---|---|---|
| 3,029,505 | 4/1962 | Reichenbaum | 29/501 |
| 3,526,814 | 9/1970 | Piedra et al. | 317/234 |
| 3,595,719 | 7/1971 | Pomerantz | 156/17 |
| 3,611,065 | 10/1971 | Zschauer et al. | 317/234 R |
| 3,728,236 | 4/1973 | Weller et al. | 204/129.1 |
| 3,805,123 | 4/1974 | Rieger | 317/234 R |
| 3,829,598 | 8/1974 | Darnell | 174/15 R |
| 3,846,824 | 11/1974 | Bell | 357/80 |
| 3,973,320 | 8/1976 | Greco et al. | 29/578 |
| 4,124,864 | 11/1978 | Greenberg | 357/70 |
| 4,278,990 | 7/1981 | Fichot | 357/81 |
| 4,373,255 | 2/1983 | Goronkin | 29/580 |
| 4,667,101 | 5/1987 | Clements et al. | 29/832 |
| 4,769,399 | 9/1988 | Schenz | 523/213 |
| 4,802,532 | 2/1989 | Dawes et al. | 165/80.3 |
| 4,859,722 | 8/1989 | Shiobara et al. | 523/433 |
| 4,861,833 | 8/1989 | Chasser et al. | 525/122 |
| 4,874,548 | 10/1989 | Hajovsky | 252/511 |
| 4,880,570 | 11/1989 | Sanborn et al. | 252/512 |
| 4,897,508 | 1/1990 | Mahulikar et al. | 174/52.4 |
| 5,041,481 | 8/1991 | Sugimori et al. | 524/188 |
| 5,068,708 | 11/1991 | Newman | 357/68 |
| 5,087,314 | 2/1992 | Sandborn et al. | 156/330 |
| 5,111,277 | 5/1992 | Medeiros, III et al. | 257/720 |
| 5,172,301 | 12/1992 | Schneider | 361/717 |
| 5,237,205 | 8/1993 | Newman | 257/783 |
| 5,245,510 | 9/1993 | Honda | 361/718 |
| 5,247,203 | 9/1993 | Shigihara et al. | 257/713 |
| 5,258,577 | 11/1993 | Clements | 174/88 R |
| 5,272,375 | 12/1993 | Belopolsky | 257/717 |
| 5,313,365 | 5/1994 | Pennisi et al. | 361/760 |
| 5,402,006 | 3/1995 | O'Donley | 257/796 |
| 5,403,784 | 4/1995 | Hashemi et al. | 437/267 |
| 5,528,458 | 6/1996 | Yasuho et al. | 361/718 |
| 5,629,835 | 5/1997 | Mahulikar et al. | 361/719 |

*Primary Examiner*—Mahshid D. Saadat
*Assistant Examiner*—Allan R. Wilson
*Attorney, Agent, or Firm*—Jenkens & Gilchrist

[57] ABSTRACT

A semiconductor package and method for preparing same to obtain improved die adhesion to organic chip carriers has been developed. A copper die bond pad is coated with a passivation material and attached to an organic card with the same passivation material. A semiconductor die may be adhered to the coated die bond pad with either the same passivation material or a common die bond adhesive. Alternatively, the passivation material is coated only on the portion of the die bond pad where the die is attached, and common die bond adhesive attaches the die bond pad to the organic card.

14 Claims, 1 Drawing Sheet

5,955,782

APPARATUS AND PROCESS FOR IMPROVED DIE ADHESION TO ORGANIC CHIP CARRIERS

This application is a continuation of application Ser. No. 08/484,809, filed on Jun. 7, 1995, which was abandoned upon the filing hereof.

FIELD OF THE INVENTION

This invention relates generally to semiconductor packages and, more particularly, to semiconductor packages having improved die adhesion to organic chip carriers.

BACKGROUND OF THE INVENTION

Many organic chip carriers are designed to attach the semiconductor die to copper die bond pads or heat spreaders or stiffeners (all three being the same element and hereinafter referred to as the die bond pad) using organic adhesives. The copper die bond pad typically requires passivation, however, to prevent changes in the oxidation of the copper during processing prior to the die bond operation. Typically, the die bond pad is passivated by plating it with a noble metal such as gold. However, most known die bond adhesives demonstrate poor adhesion to gold. This can result in die bond failures during assembly, testing, and end use.

Consequently, a process for making and a resulting semiconductor package with a significant increase in die adhesion to the copper substrate of die bond pads, thus eliminating failures during assembly, testing and end use, would be desirous in the industry.

SUMMARY OF THE INVENTION

According to the present invention, a new method for attaching a semiconductor die to a copper die bond pad using organic adhesives or passivation layers has been discovered. One preferred method comprises coating a copper die bond pad with a passivation material; adhering an organic card to the die bond pad with an additional coating of the passivation material; curing the passivation material coatings; and adhering a semiconductor die to a surface of the cured passivation material coating on the die bond pad. In an alternative method of the invention, surfaces of the copper die bond pad are pretreated prior to being coated with the passivation material. In another alternative method, the organic card is adhered to the die bond pad with an adhesive, instead of the passivation material.

An alternative method of the invention comprises coating a copper die bond pad with a passivation material; adhering an organic card to the coated die bond pad; curing the passivation material coating; and adhering a semiconductor die to a surface of the cured passivation material.

Yet another alternative method of the invention comprises coating a copper die bond pad with a passivation material on that portion of the pad where the semiconductor die will be attached; curing the passivation material coating; adhering an organic card to the die bond pad with an adhesive; and adhering a semiconductor die to the surface of the cured passivation material on the die bond pad.

The apparatus of the present invention is a semiconductor package comprising a semiconductor die; a die bond pad attached to said semiconductor die, said die bond pad having a copper core and a passivation coating covering the die bond pad; and an organic card attached by the passivation coating or other adhesive to the die bond pad.

An alternative apparatus of the present invention comprises a semiconductor package having a semiconductor die; a die bond pad adjacent to said semiconductor die, said die bond pad having a copper core and a passivation coating covering the surface of the die bond pad where the die adheres; and an organic card attached by an adhesive to the die bond pad. The adhesive may be the passivation material.

An advantage of the method and apparatus of the invention is a significant increase in die adhesion to the copper substrate of a die bond pad, thus eliminating failures during assembly, testing, and end use. Further, in the embodiment where the passivation material is coated on both the organic card and the copper die bond pad and cured into one adhesive layer, the passivation material is serving dual functions as both a passivation material and an adhesive.

Still other objects, features and advantages of the present invention will be apparent from the following description of the preferred embodiments given for the purpose of disclosure and taken in conjunction with the accompanying drawings.

DETAILED DESCRIPTION OF THE PREFERRED EMBODIMENT

Figure 1:
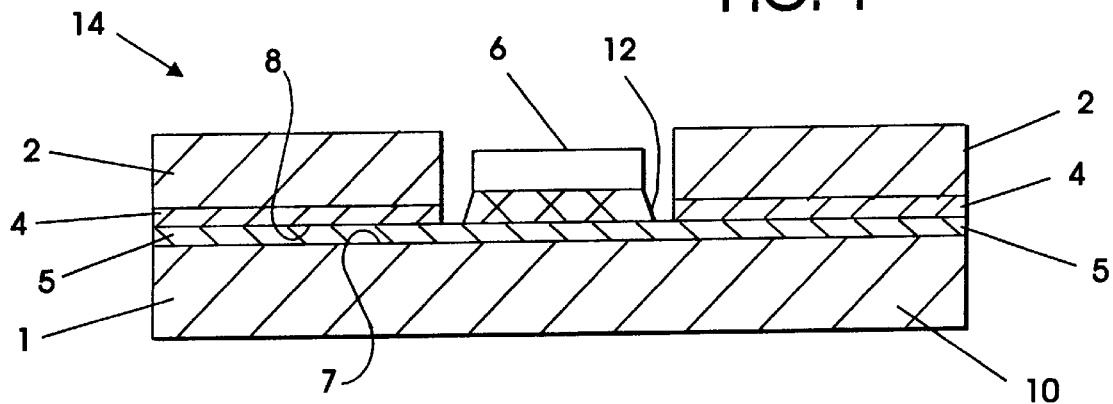
FIG. 1 is a partial cross-sectional view of a semiconductor package according to one preferred embodiment of the invention.

Referring to FIG. 1 of the drawings, a partial cross-sectional view of a semiconductor package 14 manufactured according to a preferred method of the present invention is shown. First, the surfaces 7 of the die bond pad 1 may be pretreated. Such pretreatment preferably involves substantially uniformly oxidizing the surfaces 7 of the copper die bond pad 1 to cuprous oxide using a commercially available chloriting process (Shipley Co., Mass.). Other possible pretreatments include, but are not limited to mechanical roughening with pumice; spraying with an aluminum oxide water slurry spray (commercially available from Vapor Blast Co.); and chemical precleaning by microetching the copper (e.g., with sodium persulfate), all of which are treatments known to those skilled in the art. Next, the copper die bond pad 1 or stiffener or heat spreader, all three being the same element and referred to hereinafter as a die bond pad, is coated with a protective layer which acts as a passivation material 5, preventing further changes in the oxidation of the die bond pad 1 copper 10. The passivation material 5 may be any epoxy based material, silicone based adhesive, or other material with good adhesion to copper, good bond strength when between the die bond pad 1 and card 2, a broad range of temperature resistance for both high and low temperatures, and low moisture uptake.

In one embodiment of the invention, the passivation material 5 is filled with a thermally conductive filler, such as boron nitride, zinc oxide, diamond fill or aluminum oxide. Further, epoxy based materials already containing thermally conductive fillers that may be used are commercially available. Some of these are as follows: CW8704 (Ciba-Gigy Corp., East Lansing, Mich.), Tra-Bond 2254 (Tra-Con Inc., Medford, Mass.), ABLEBOND® 789-4 (Ablestik, Rancho Dominguez, Calif.), Supreme 10A0HT (Master Bond, Inc., Hackensack, N.J.), and EPO-TEK ® H77 or 920 or 921FL (all from Epoxy Technology Inc., Billerica, Mass.).

In another embodiment of the invention, the epoxy based passivation material is mixed with a material that is electrically and thermally conductive, including but not limited to, silver particles and copper particles, creating a mixture that is electrically conductive. This allows the die bond pad 1 to be electrically common to vias or pads on the back of an organic card 2 of organic chip carrier 16. Of course, these vias or pads may be selectively exposed while protecting additional circuitry using a soldermask or other electrically insulating imagable coating on the back of the card 2 of organic chip carrier 16. In another preferred embodiment of the invention, the epoxy based passivation material 5 is mixed with two or more materials that are either thermally or electrically conductive. In the most preferred embodiment, the passivation material 5 is an anhydride cured epoxy novalac soldermask material and most preferably is a material identified in U.S. Pat. No. 4,292,230 entitled "Screen-Printing Composition and Use Thereof", issued Sep. 29, 1981 (also referred to hereinafter as "Epoxy 240").

When Epoxy 240 is used as the passivation material 5, it is applied substantially uniformly in a thin layer on the copper die bond pad 1 using a screen coating technique. The thickness of the passivation material 5 should be varied depending upon its chemical components. Typically, the material 5 is applied in a thickness in the range of about 0.0001 to about 0.050 inch. Epoxy 240 is preferably applied in a layer of about 0.0001 inch to about 0.015 inch and most preferably is about 0.0008 inch or less. When the passivation material 5 is filled with a thermally conductive filler such as boron nitride or zinc oxide, a thicker layer of passivation material 5 may be applied on the die bond pad 1 in the range of about 0.0001 to about 0.050 inch, and most preferably is in the range of about 0.003 inch or less.

The die bond pad 1 is then dried by any means of drying epoxy based materials, many of which are well known to those skilled in the art. In the preferred method, the coated die bond pad 1 is air dried for a time period in the range of about 0 to about 120 minutes at a temperature in the range of about 20 to about 150° C. A more preferred method is to air dry the coated die bond pad 1 for about 60 to about 120 minutes, and most preferably for 90 minutes at ambient temperature.

Next, an organic card 2 containing circuitry and wire bond pads is adhered to the die bond pad 1 with an additional coating 4 of the passivation material described above in relation to the die bond pad 1. The resulting structure of die bond pad 1 and card 2 with passivation material 4, 5 is preferably cured at a temperature range of about 120 to about 180° C. for a time period in the range of about 1 to about 6 hours. More preferably, the curing is conducted at a temperature of about 150° C. for about 3 hours. Methods of curing epoxy based materials are well known to those skilled in the art and any of the well known methods of curing may be used in the present invention that result in cured passivation material 4, 5, such as light activated or light and heat activated curing methods.

The Epoxy 240 is screen coated over the die bond pad 1 and also the organic card 2 using preferably a 200 mesh stainless steel screen, which are commercially available (Tetko Inc., Briar Cliff Manor, N.Y.). One skilled in the art will recognize that other coating techniques may also be used to apply coating materials with a wide range of viscosities. In the present invention, other coating techniques for applying the passivation material 4, 5 include, but are not limited to, curtain coating, roller coating, spray coating, and laminating dry films.

Following additional processing steps to the organic chip carrier 16 that may be desired, such as, but not limited to, additional copper or gold plating, additional baking cycles, plasma surface treatments, or water washes by way of example, a semiconductor die 6 is joined to a surface 8 of the passivation material 5 coated on the die bond pad 1 using either the passivation material 5 or common die bond adhesive(s) 12 well known in the art. In the preferred method, a die bond adhesive 12 such as ABLEBOND® 965-1L or ABLEBOND® 8360 (Ablestik, Rancho Dominguez, Calif.) is used to join the die 6 to the die bond pad 1, wherein the ABLEBOND® 965-1L and ABLEBOND® 8360 are epoxy based materials containing thermally conductive fillers. Such die bond adhesives are cured according to their recommended thermal cure cycles.

In an alternative embodiment of the invention, a different material is used for the joining adhesive than for the die pad passivation coating. This allows the best material for the die pad passivation coating to be chosen as well as the best adhesive material for adhering the die in cases where otherwise a compromise would be necessary.

The die bond adhesion values, as measured by fractured toughness techniques, for different combinations of die bond adhesives and substrates have been tested and are listed below in Table I. The adhesion values are shown in pounds per square inch times square root of inch. From Table I, it can be seen that an adhesion value of an interface of the passivation coating and the die bond adhesive in accordance with the present invention, in which the passivation coating is an epoxy based material (e.g., Epoxy 240), is greater than an adhesion value of the interface of a noble metal passivation coating and the die bond adhesive, in which the later passivation coating is a noble metal (e.g., gold). The first three rows of Table I are directed to a gold passivation material and a corresponding die bond adhesive which provided adhesion values ranging from a low of 16 PSI.SQRT-IN to a high of 392 PSI.SQRT-IN. The last two rows of Table I are directed to a passivation material of Epoxy 240 and a corresponding die bond adhesive which provided adhesion values ranging from a low of 817 PSI.SQRT-IN to a high of 2140 PSI.SQRT-IN. In other words, the passivation coating of an epoxy base material and die bond adhesive according to the present invention provides a passivation/die bond adhesive interface with an adhesion value which is greater that an adhesion value provided by the interface of a passivation coating of a noble metal and die bond adhesive. As can be interpreted from the adhesion values of table I, the adhesion value of the passivation/die bond adhesive interface according to the present invention is greater by an amount on the order of 2–5 times greater.

TABLE I

| PASSIVATION MATERIAL | DIE BOND ADHESIVE | ADHESION VALUE (PSI · SQRT-IN) |
| --- | --- | --- |
| Gold | 965 | 392, 242 |
| Gold | 965 | 208, 47 |
| Gold | 8360 | 222, 16 |
| Epoxy 240 | 965 | 2140, 888, 817 |
| Epoxy 240 | 8360 | 1775, 1004 |

Testing revealed that when the die bond pad 1 was plated with gold, die bond failures occurred at the gold/die bond adhesive interface. When the die bond pad 1 was coated with Epoxy 240, according to the preferred embodiment of the invention as described above, the die bond failures were either cohesive in the die attach adhesive or occurred as a cohesive failure of the chip itself (i.e., the chip itself fractured).

Figure 2:
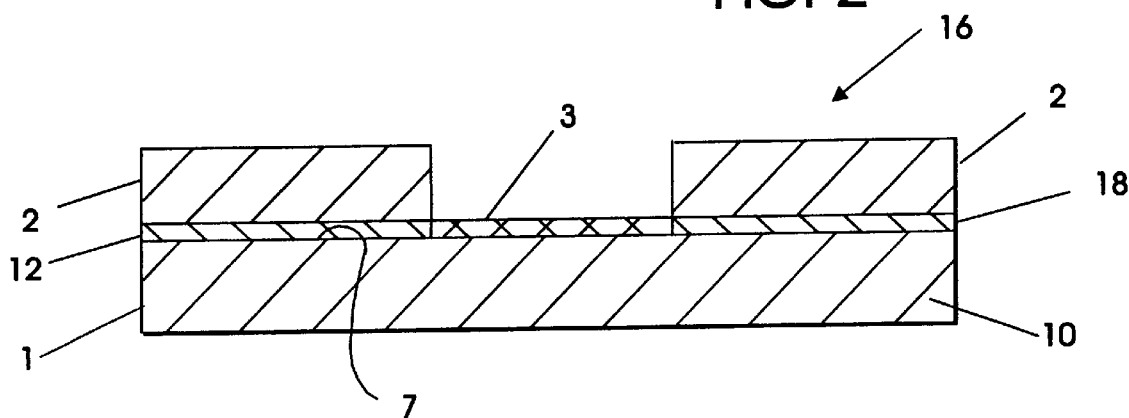
FIG. 2 is a partial cross-sectional view of a prior art semiconductor package showing a die bond pad coated with a noble metal.

The semiconductor package 14 of the present invention avoids plating of the die bond pad 1 with noble metals such as gold for passivation purposes. In FIG. 2, a prior art semiconductor package 14P in partial cross-sectional view is shown. In FIG. 2, the organic card 2 is adhered to the copper die bond pad 1 with a die bond adhesive 18. However, at the portion of the die bond pad 1 where the die 6 is attached, the surface 7 of the pad 1 is plated with a noble metal such as gold 3 for passivation purposes. The gold plated surface 3 shown in FIG. 2 is eliminated in the present invention through use of the passivation material 4, 5 and, thus, does not appear in FIG. 1.

In an alternative method of the invention, the same preferred method as described above is followed, except that the coating of passivation material 4 on the organic card 2 is eliminated. The organic card 2 is adhered directly to the copper die bond pad 1 that is coated with one layer of passivation material 5. The passivation material 5 is cured by the methods described above, thus bonding the die bond pad 1 and organic card 2. The resulting structure is referred to as the organic chip carrier 16. In this alternative method, the drying step of the above preferred method may be eliminated.

Figure 3:
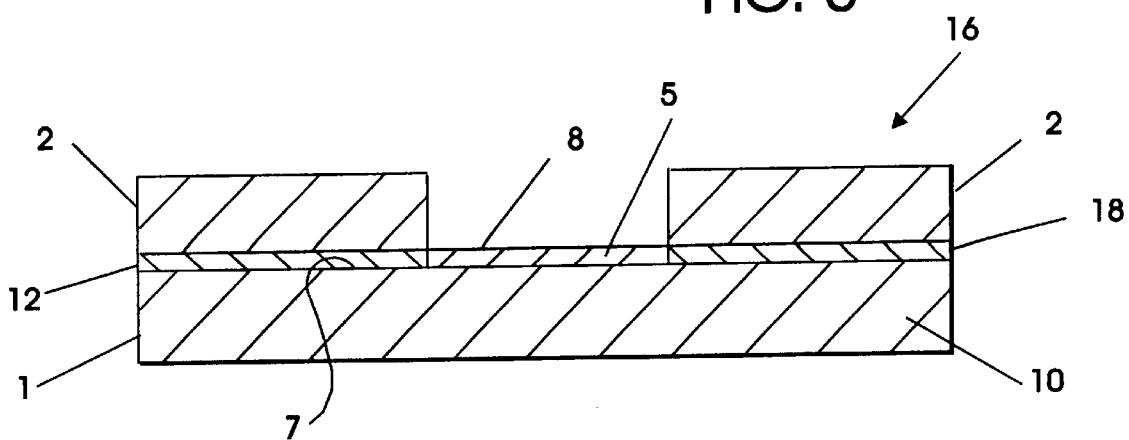
FIG. 3 is a partial cross-sectional view of a semiconductor package according to an alternative embodiment of the invention.

In another alternative method of the invention, the preferred method of the invention is followed, except that passivation material 5 is coated on the copper die bond pad 1 only on the portion 8A of it, as shown in FIG. 3, where the semiconductor die will attach. The semiconductor die 6 will be adhered to the passivation material 5 on the pad 1. A further difference in this method is that the organic card 2 is attached to the die bond pad 1 with either an adhesive 18 or the passivation material 5.

Referring again to FIG. 1, the semiconductor package 14 of the present invention comprises a semiconductor die 6 which is adhered to a die bond pad 1 having a copper core 10 and a passivation material 5 coated on its surface 7. The die bond adhesive 1 between the semiconductor die 6 and the coated die bond pad 1 may be either the passivation material 5 or a die bond adhesive 12 commonly known in the art, as described above in the preferred method of the invention. The die bond pad 1 is also adjacent to and adhered to an organic card 2 by a layer of passivation material 4, 5.

The passivation coating 4, 5 on the die bond pad 1 and organic card 2 is preferably an epoxy based material as described above. Most preferably, the passivation material 4, 5 is an anhydride cured epoxy novalac soldermask material and most preferably is Epoxy 240. In one alternative embodiment of the invention, the epoxy based material is mixed with a thermally conductive material. In another embodiment of the invention, the epoxy based material is mixed with an electrically conductive material creating a mixture that is electrically and thermally conductive. These alternative embodiments are discussed above in more detail in the discussion of the preferred method.

The thickness of the passivation coating 4, 5 on either the die bond pad 1 or the organic card 2 is in a range of about 0.0001 to about 0.050 inch. Where the passivation coating 4, 5 is Epoxy 240, the passivation coating is preferably a thickness of about 0.0001 to about 0.0015 inch and more preferably is 0.0008 inch or less. Where the passivation coating is filled with a thermally conductive filler such as boron nitride, zinc oxide, diamond fill, or aluminum oxide, it has a thickness of about 0.0001 to about 0.050 inch, and preferably is in the range of about 0.001 to about 0.003 inch or less.

Another alternative embodiment of the present invention, as shown in FIG. 3, is similar to the above described semiconductor package 14, except that the die bond pad 1 is coated with passivation material 5 only on the portion 8A of the die bond pad 1 where the die will attach. A semiconductor die will be bonded to the die bond pad 1 by the passivation material 5. An organic card 2 is attached, moreover, to the die bond pad by either the passivation material 5 or a common die bond adhesive 18.

A few preferred embodiments have been described in detail above. It is to be understood that the scope of the invention also comprehends embodiments different from those described, yet within the scope of the claims.

Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A semiconductor package, comprising:

a semiconductor die;

a die bond pad having a copper core with a passivaton coating on a surface of said die bond pad, wherein the passivation coating includes a cured epoxy based material, the cured epoxy based material further including an electrically and thermally conductive material, further wherein said semiconductor die is attached to said die bond pad at the passivation coating with a die bond adhesive thereby forming a passivation coating/die bond adhesive interface having an adhesion value of the interface of the passivation coating and the die bond adhesive which is greater than an adhesion value provided by an interface of a noble metal passivation coating and a die bond adhesive by an amount on the order of 2–5 times greater; and an organic card attached to said die bond pad at the passivation coating in a region other than where said semiconductor die is attached.

2. The semiconductor package of claim 1, wherein the organic card is attached at the passivation coating by the passivation coating.

3. The semiconductor package of claim 1, wherein the organic card is attached at the passivation coating by an adhesive.

4. The semiconductor package of claim 1, wherein the passivation coating is an anhydride cured epoxy novalac soldermask material.

5. The semiconductor package of claim 1, wherein the epoxy based material contains an electrically and thermally conductive material.

6. The semiconductor package of claim 1, wherein the passivation coating has a thickness in the range of about 0.0001 to about 0.050 inch.

7. The semiconductor package of claim 1, wherein the passivation coating has a thickness of about 0.0008 inch.

8. The semiconductor package of claim 1, wherein the passivation coated surface of said die bond pad includes a surface that has been surface treated prior to having been coated with the passivation coating material.

9. A semiconductor package, comprising;

a semiconductor die;

a die bond pad having a copper core with a passivation coating on a surface of said die bond pad where said semiconductor die adheres, wherein the passivation coating includes a cured epoxy based material, the cured epoxy based material further including an electrically and thermally conductive material, further wherein said semiconductor die is attached to said die bond pad at the passivation coating with a die bond adhesive thereby forming a passivation coating/die bond adhesive interface having an adhesion value at the interface which is greater than an adhesion value provided by an interface of a noble metal passivation coating and a die bond adhesive by an amount on the order of 2–5 times greater; and an organic card attached by an adhesive to said die bond pad.

10. The semiconductor package of claim 9, wherein the adhesive for attaching said organic card to said die bond pad is the passivation coating.

11. The semiconductor package of claim 9, wherein the passivation coating is an anhydride cured epoxy novalac soldermask material.

12. The semiconductor package of claim 9, wherein the passivation coating has a thickness in the range of about 0.0001 to about 0.050 inch.

13. The semiconductor package of claim 9, wherein the passivation coating has a thickness of about 0.0008 inch.

14. The semiconductor package of claim 9, wherein the passivation coated surface of said die bond pad includes a surface that has been surface treated prior to having been coated with the passivation coating material.

* * * * *